United States Patent
Hess et al.

(10) Patent No.: US 6,599,761 B2
(45) Date of Patent: Jul. 29, 2003

(54) MONITORING AND TEST STRUCTURES FOR SILICON ETCHING

(75) Inventors: Jeffery S. Hess, Corvallis, OR (US); Steven D. Leith, Albany, OR (US); Donald W. Schulte, Corvallis, OR (US); William Edwards, Albany, OR (US); Jeffrey S. Obert, Corvallis, OR (US); Timothy R. Emery, Corvallis, OR (US)

(73) Assignee: Hewlett-Packard Development Company, Houston, TX (US)

( * ) Notice: Subject to any disclaimer, the term of this patent is extended or adjusted under 35 U.S.C. 154(b) by 34 days.

(21) Appl. No.: 09/917,067

(22) Filed: Jul. 26, 2001

(65) Prior Publication Data
US 2003/0022397 A1 Jan. 30, 2003

(51) Int. Cl.[7] .............................................. H01L 21/00
(52) U.S. Cl. ............................ 438/11; 438/17; 438/18; 438/21
(58) Field of Search ............................... 438/10, 11, 17, 438/18, 21

(56) References Cited

U.S. PATENT DOCUMENTS

| | | | | |
|---|---|---|---|---|
| 4,197,632 A | * | 4/1980 | Aomura | 257/48 |
| 4,338,157 A | * | 7/1982 | Kanda | 156/345 |
| 5,234,868 A | * | 8/1993 | Cote | 438/16 |
| 5,321,304 A | * | 6/1994 | Rostoker | 257/621 |
| 5,895,223 A | * | 4/1999 | Peng et al. | 438/18 |
| 6,015,754 A | * | 1/2000 | Mase et al. | 156/345 |
| 6,072,313 A | * | 6/2000 | Li et al. | 216/86 |
| 6,087,189 A | * | 7/2000 | Huang | 438/10 |
| 6,204,073 B1 | * | 3/2001 | Nandakumar et al. | 438/17 |
| 6,303,396 B1 | * | 10/2001 | Ring et al. | 438/14 |
| 6,342,401 B1 | * | 1/2002 | Tom | 438/17 |

FOREIGN PATENT DOCUMENTS

| | | | | |
|---|---|---|---|---|
| JP | 358048671 A | * | 3/1983 | 438/13 |
| JP | 60-106976 | | 6/1985 | C23F/1/100 |
| JP | 360106976 A | * | 6/1985 | 216/22 |
| JP | 363084116 A | * | 4/1988 | |

OTHER PUBLICATIONS

Beatty, Christopher, et al., U.S. patent application No. 09/956,235, filed Oct. 22, 1997, A Printhead With A Fluid channel Therethrough. (Attorney Docket 10970794).

Nikkel, Erik L. U.S. patent application No. 09/770,723, filed Jan. 25, 2001. Two–Step Trench Etch For A Fully Integrated Thermal Inkjet Printhead. (Attorney Docket No. 10001922).

Tom, Dennis W. U.S. patent application No. 09/772,396, filed Jan. 29, 2001, Test Structures for Silicon Etching. (Attorney Docket 10004104).

Obert, Jeffrey S., et al. U.S. patent application No. 09/888,975, filed Jun. 22, 2001, Slotted Substrate And Slotting Process. (Attorney Docket No. 10007457).

* cited by examiner

Primary Examiner—John F. Niebling
Assistant Examiner—Angel Roman
(74) Attorney, Agent, or Firm—Timothy F. Myers

(57) ABSTRACT

A through-substrate etching process is monitored by providing a sacrificial electrode in proximity to a desired etch window on the substrate. An etch process is performed on the substrate. The etch process is monitored by measuring an electrical property of either the substrate or the sacrificial electrode or both.

7 Claims, 12 Drawing Sheets

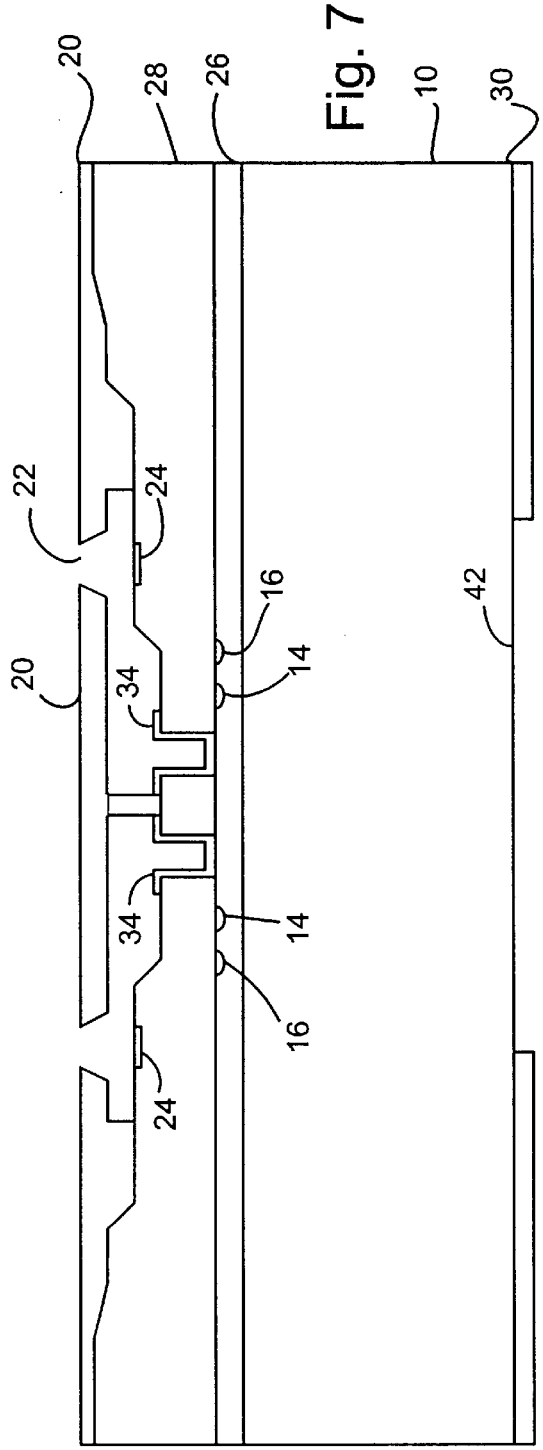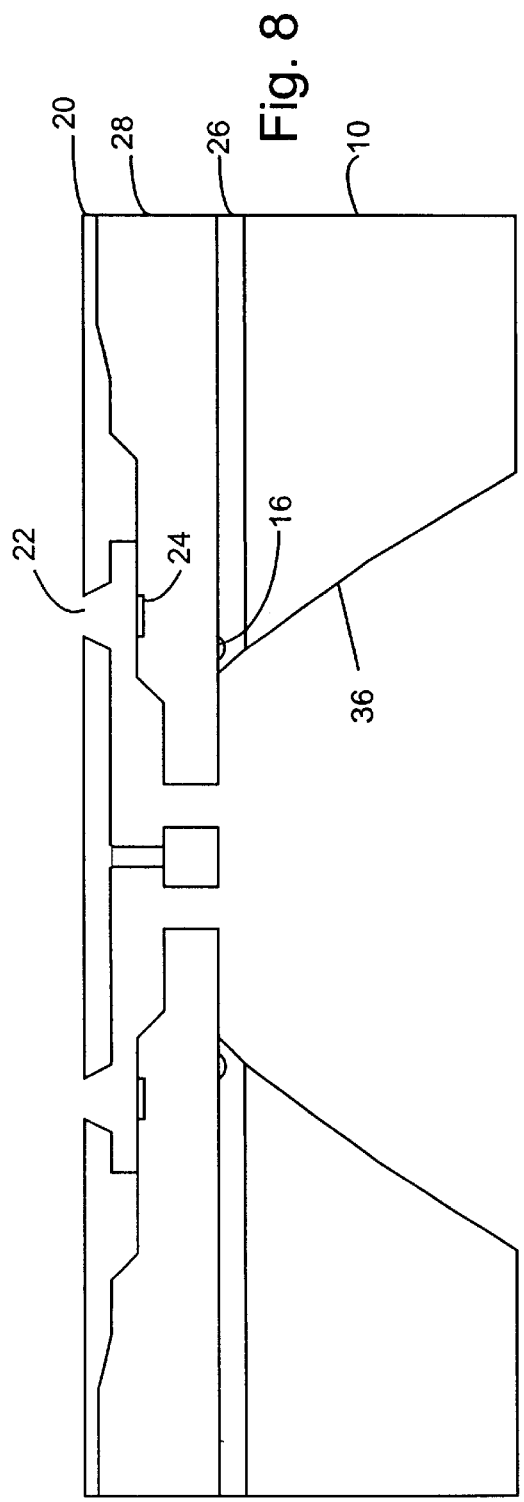

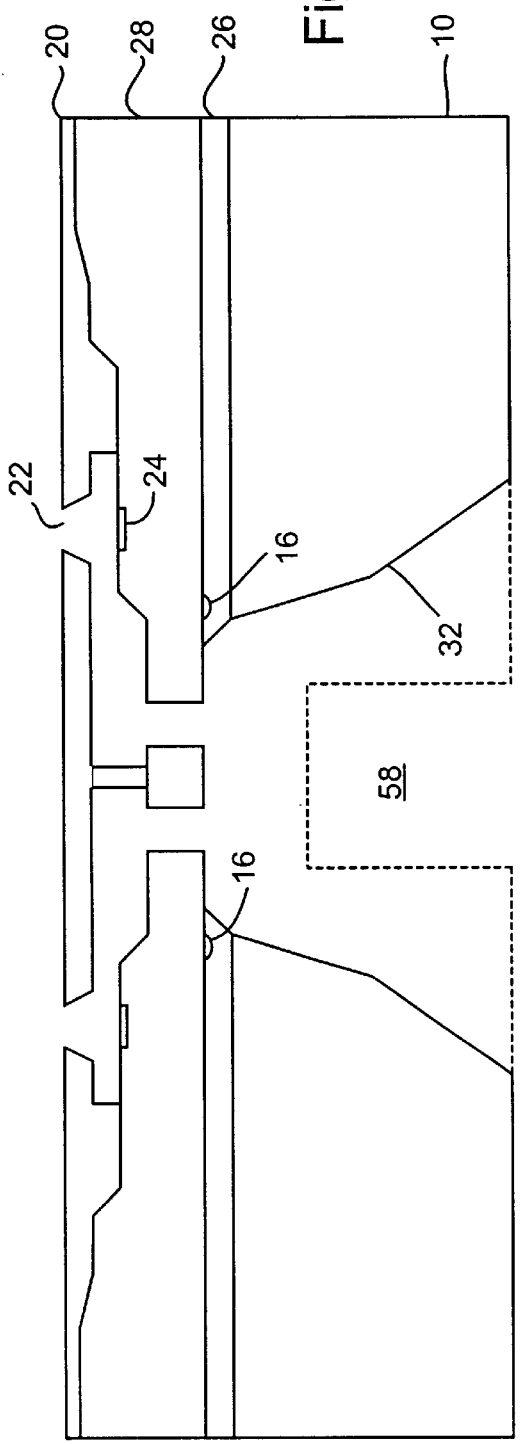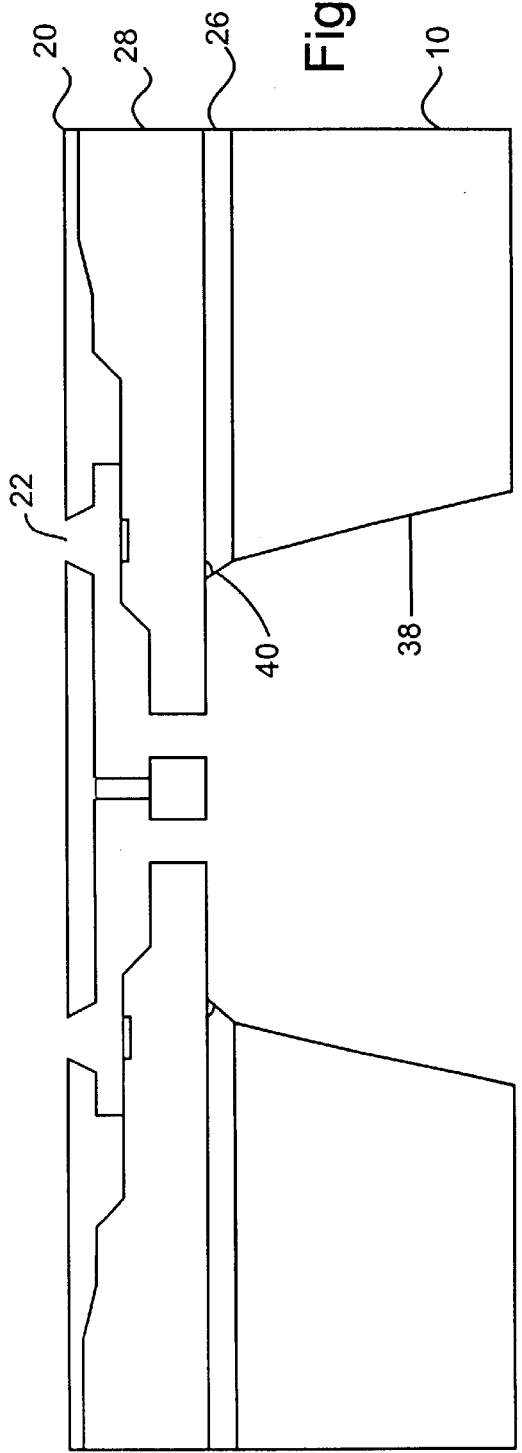

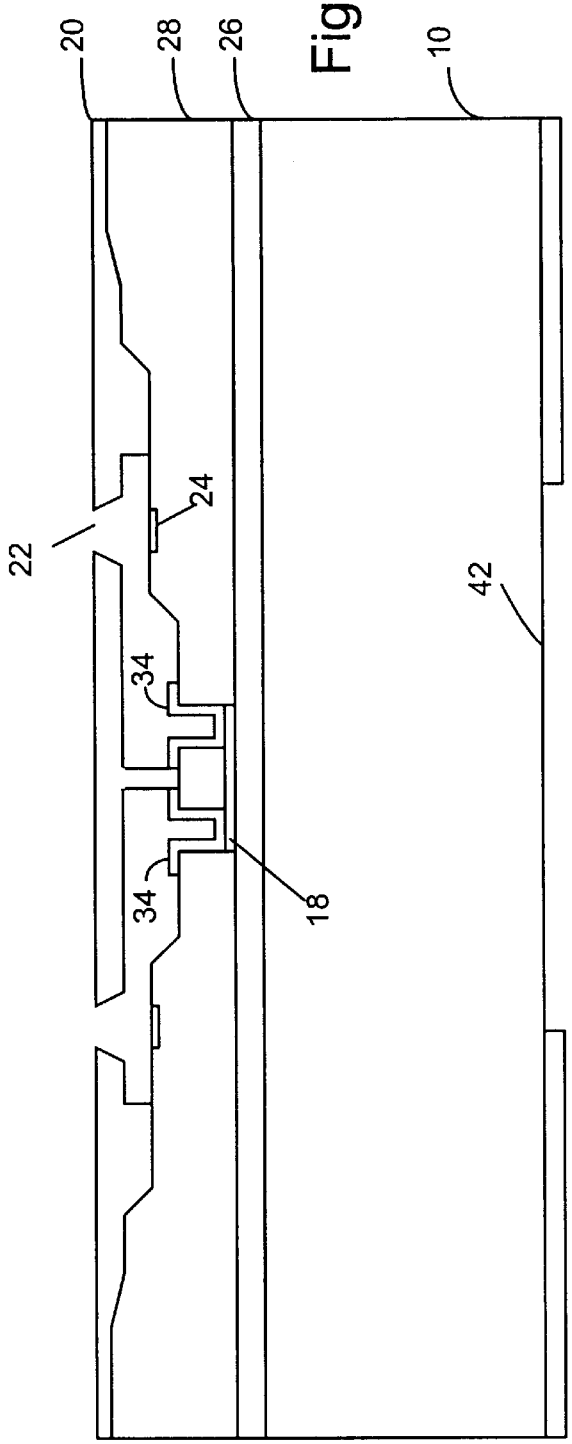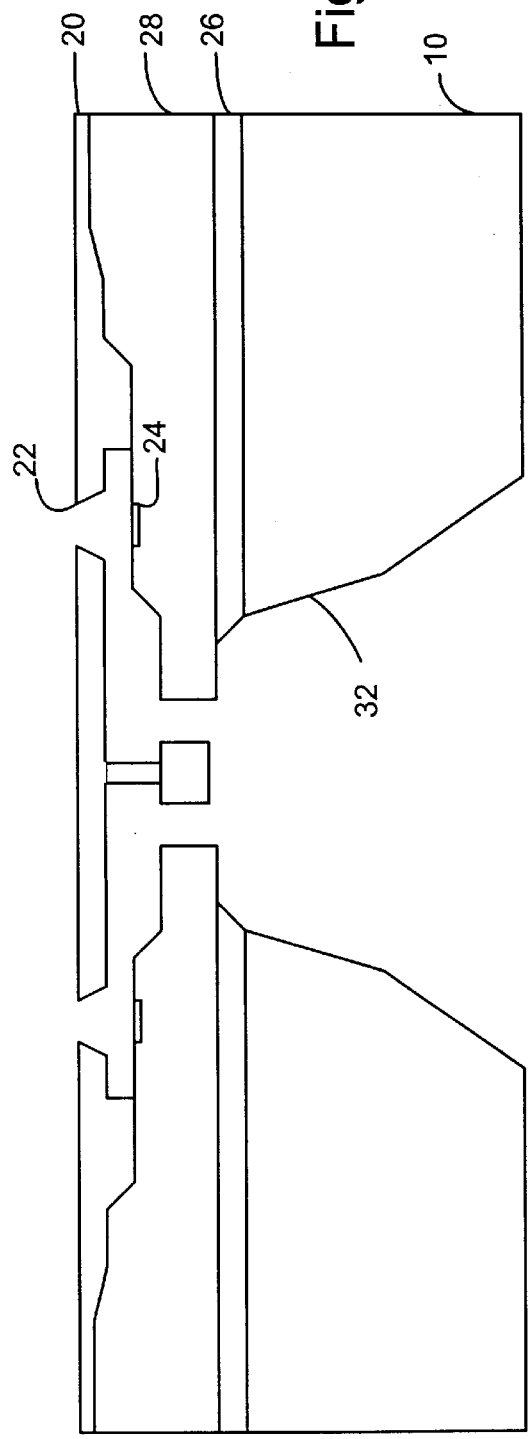

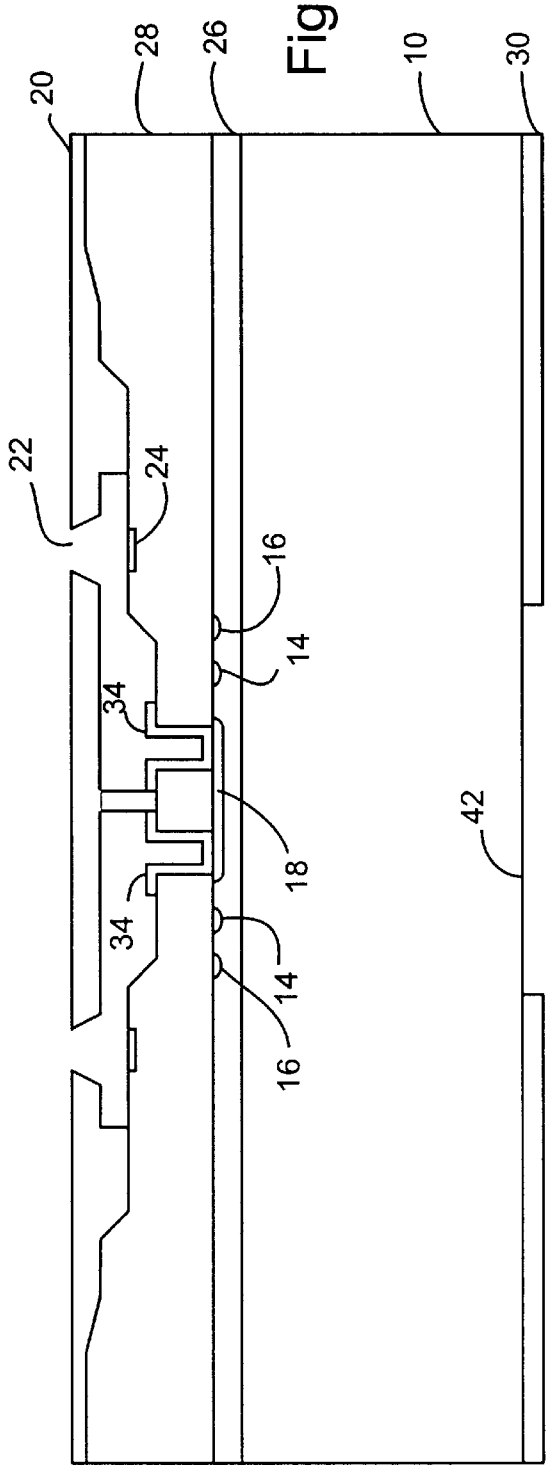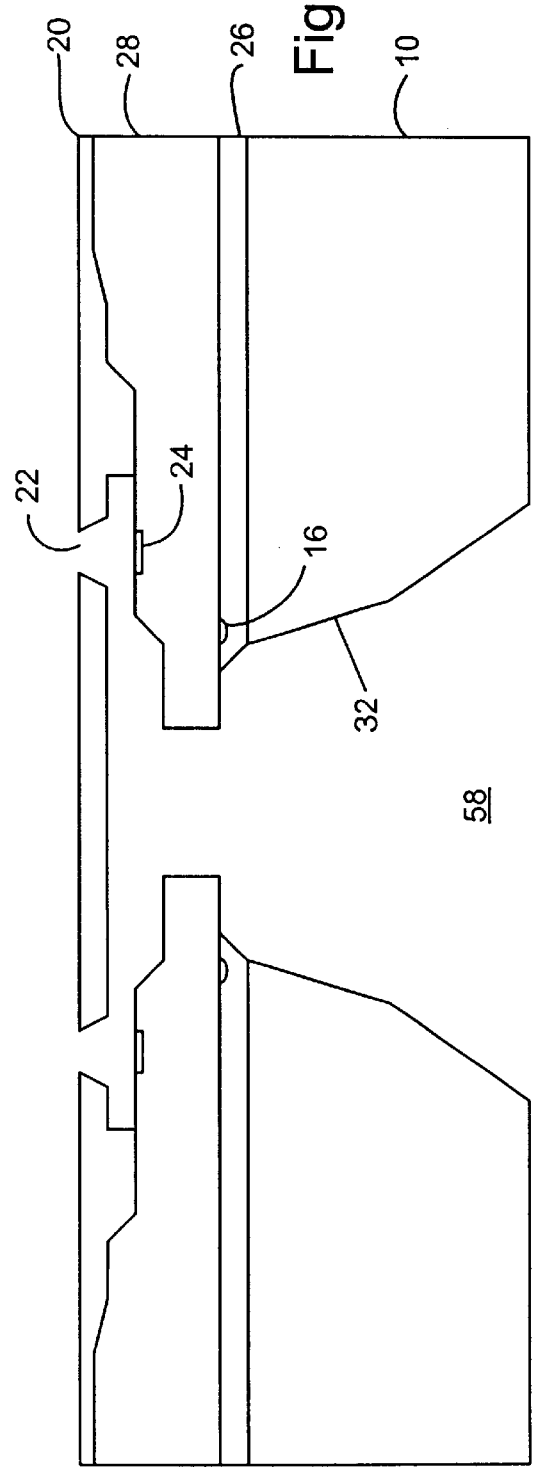

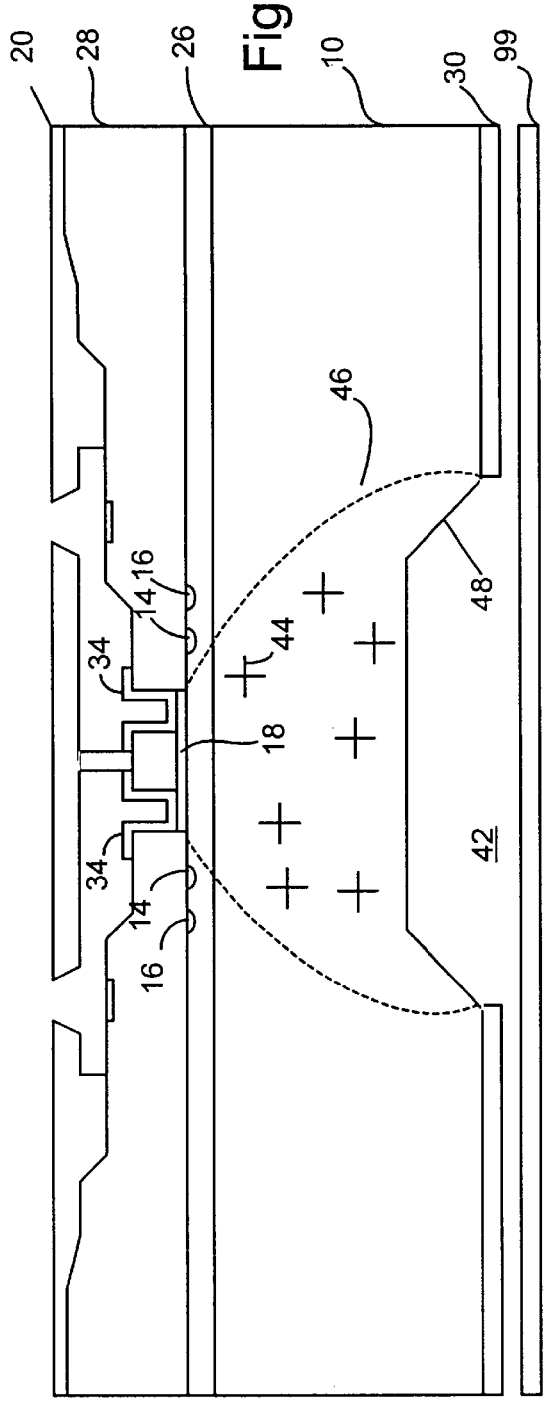
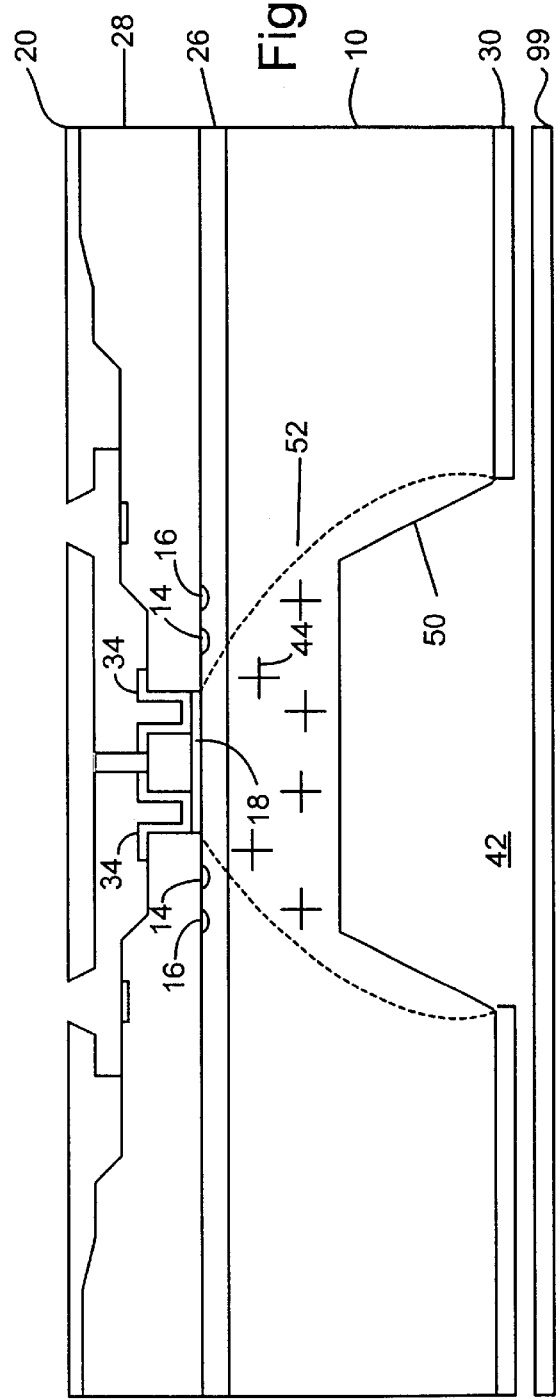

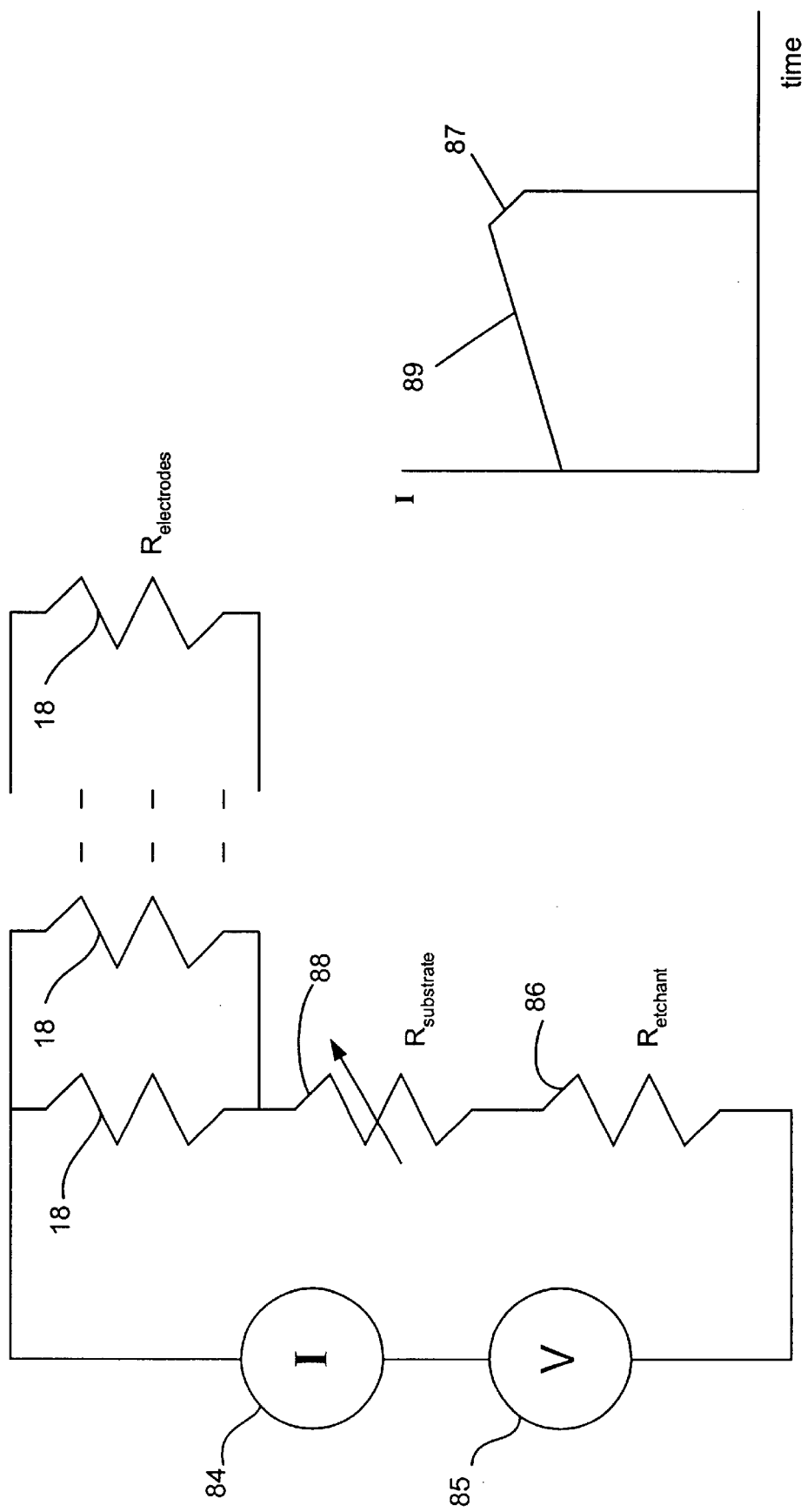

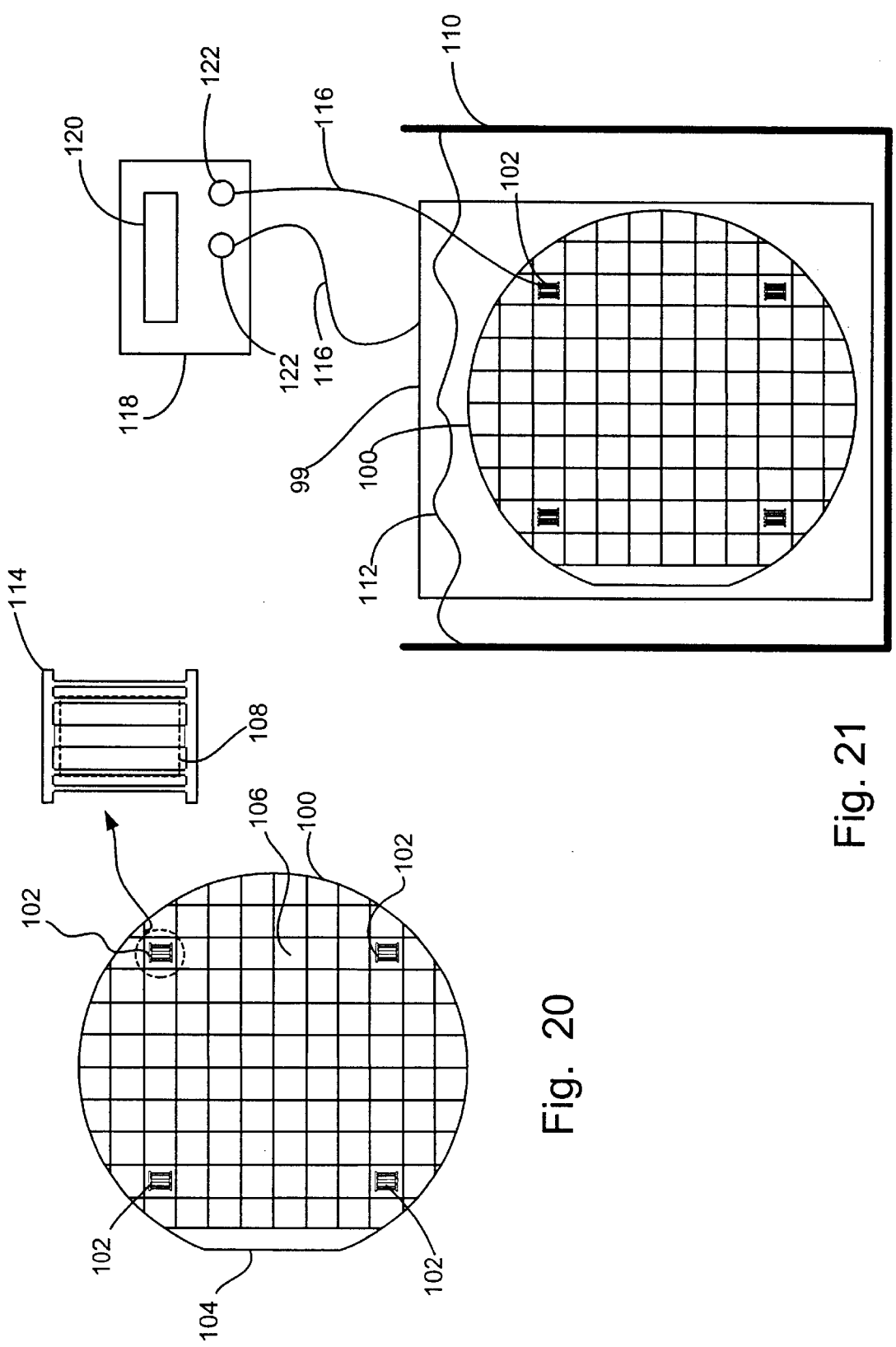

MONITORING AND TEST STRUCTURES FOR SILICON ETCHING

FIELD OF THE INVENTION

This invention relates to parametric test structures for integrated circuits, more particularly, this invention relates to a test structure to measure the progress, completion, and results of through-substrate etching in substrates.

BACKGROUND OF THE INVENTION

Silicon etching is being aggressively pursued in micro-machining such as with the fabrication of fluid ejection devices such as ink-jet printheads. During the fabrication of such fluid ejection devices, expensive vision tools or high cost operators are used to monitor and measure the parameters of trench etching in silicon or other substrates. Such parameters include trench depth, trench width, and trench length to name a few. Manufacturers have used these visual monitoring techniques even though they are expensive and prone to error especially when manual labor is used. In addition, when these visual monitoring techniques are used in high volume operations, fatigue and other human factor issues such as ergonomics must be factored into the process, thereby increasing costs. Unless an approach is found which reduces the human interaction involved with measuring trench parameters, costs will continue to increase making micro-machining less attractive as a new technology.

SUMMARY

A through-substrate etching process is monitored by providing a sacrificial electrode in proximity to a desired etch window on the substrate. An etch process is performed on the substrate. The etch process is monitored by measuring an electrical property of either the substrate or the sacrificial electrode or both.

BRIEF DESCRIPTION OF THE DRAWINGS

The invention is better understood with reference to the following drawings. The elements of the drawings are not necessarily to scale relative to each other. Rather, emphasis has instead been placed upon clearly illustrating the invention. Furthermore, like reference numerals designate corresponding similar though not necessarily exact parts through the several views.

FIGS. 7–16 are exemplary cross-sections of results from exemplary process steps involved in the creation of exemplary fluid-jet printheads that incorporate embodiments of the invention as viewed into the I—I perspective shown in FIG. 6.

FIG. 7 is a cross-section of an exemplary printhead having an embodiment of the invention before backside etching occurs.

FIG. 8 is a cross-section of an exemplary printhead of FIG. 7 after a backside etching process that has been partially over-etched.

FIG. 9 is a cross-section of the exemplary printhead in FIG. 7 after the backside etching process has occurred.

FIG. 10 is a cross-section of an exemplary printhead of FIG. 7 after a backside etching process that has been severely over-etched.

FIG. 11 is a cross-section of an exemplary printhead having an alternative embodiment of the invention before backside etching occurs.

FIG. 12 is a cross-section of the exemplary printhead of FIG. 11 after the backside etching process has occurred.

FIG. 13 is a cross-section of an exemplary printhead having an alternative embodiment of the invention before backside etching occurs.

FIG. 14 is a cross-section of the exemplary printhead in FIG. 13 after backside etching has occurred.

FIG. 15 is a cross-section of the exemplary printhead in FIG. 13 after a portion of the backside etching has occurred.

FIG. 16 is a cross-section of the exemplary printhead in FIG. 13 after further backside etching has occurred.

FIG. 17 is an exemplary schematic of the monitoring process shown in FIGS. 15–16.

FIG. 18 is an exemplary chart of the current monitored over time in the process shown in FIGS. 15–16.

FIG. 20 is an illustration of a substrate being an exemplary integrated circuit wafer having embodiments of the invention incorporated in at least one of a test structure and an integrated circuit.

FIG. 21 is an illustration of a test device monitoring a backside etch process using an embodiment of the invention.

DETAILED DESCRIPTION OF THE EMBODIMENTS

Figure 3:
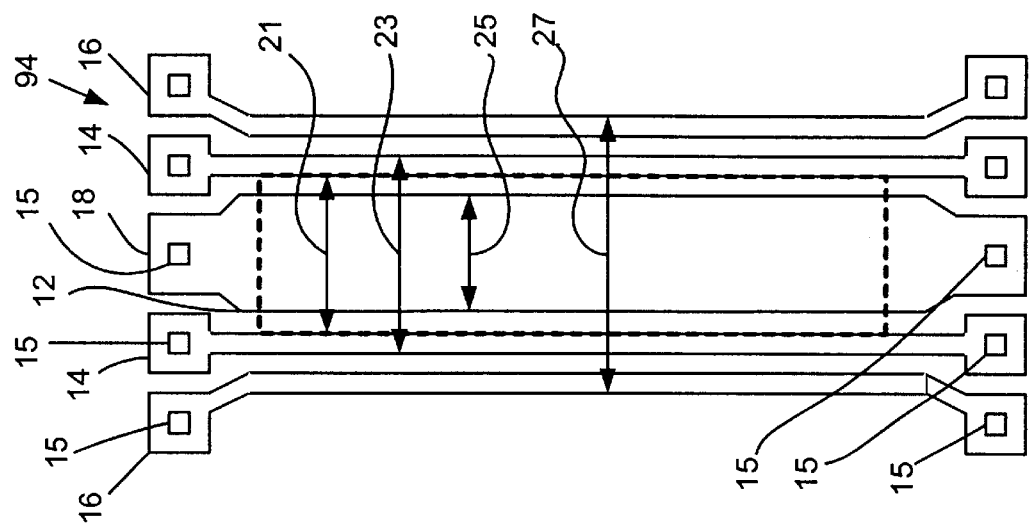
FIG. 3 is a top view of a third embodiment of the invention.

The increasing quality and performance requirements of fluid ejection applications such as ink-jet printing have produced new micro-machining techniques. One such technique is described in U.S. patent application Ser. No. 08/956,235 entitled "SINGLE-SIDE FABRICATION PROCESS FOR FORMING INKJET MONOLITHIC PRINTING ELEMENT ARRAY ON A SUBSTRATE" filed Oct. 22, 1997 and commonly assigned to the same assignee as the instant application and is herein incorporated by reference. Another such technique is described in U.S. patent application Ser. No. 09/770723 entitled "TWO-STEP TRENCH ETCH FOR A FULLY INTEGRATED THERMAL INKJET PRINTHEAD" filed Jan. 25, 2001 and commonly assigned to the same assignee as the instant application and is herein incorporated by reference. A single etch technique is described in U.S. patent application Ser. No. (Unassigned) entitled "SLOTTED SUBSTRATE AND SLOTTING PROCESS" filed Jun. 22, 2001 and commonly assigned to the same assignee as the instant application and is herein incorporated by reference. The current application is directed at making etching techniques such as those used in the above referenced applications more cost efficient over conventional processes.

Most substrate trench etching occurs when the substrate is immersed in a chemical bath. This form of etching is typically called "wet-etching". This wet etch process requires extensive tailoring and control of bath chemistry and temperature in order to satisfy etch rate, selectivity, and surface quality requirements. Alternatively, another form of etching uses a high-energy gas made up of ionized particles (a plasma) to attack portions of a substrate. This type of etching is called "dry-etching." The dry etch process requires tailoring of the gas pressure and ion concentration. A significant shortcoming to conventional processes is the inability to precisely predict or monitor etch progress that often results in unacceptable yield loss. Usually, for printheads, etching of the silicon is near the end of the printhead processing. If defects occur at this stage, it is very expensive to scrap parts that are non-conforming.

The invention uses one or more sacrificial electrodes that are disposed in-situ to a substrate that is to be etched to create through-holes or openings within the substrate. By utilizing the sacrificial electrodes, process control of the etching process is improved and automated testing of the results of the etch process is possible. Use of the sacrificial electrodes in the etching process allows for precise control of the etch rate, flexibility in processing chemistry and temperature, monitoring of real-time etch progression, and detection of the end of the etch process.

The invention allows for automatic electrical sorting of etched trenches which eliminates the need for optical inspection. Sorting is done electrically much faster than optical testing and allows for its incorporation into existing electrical tests for integrated circuits. Use of the sacrificial electrodes during testing of the fabricated components allows for increased speed of inspection, feedback of process results, higher through-put, and less variance in parts produced.

The embodiments of the invention incorporate electrodes that are either diffused resistors in the bulk of the substrate or conductive traces in metal or semiconductor thin-film layers disposed on a surface of the substrate. Detection of electrical parameters such as resistance, current, voltage or conductance is used to detect openings or changes in the electrodes that are caused by the etching of the substrate. Alternatively, if the electrode contacts the substrate and the substrate is conductive, then the resistance of the substrate can be monitored during etching or during test to reflect the etching process progress or result, respectively.

The integrated circuits shown incorporating the invention are preferably fabricated with semiconductor device technology. The devices of the present invention are applicable to a broad range of semiconductor devices technologies and can be fabricated from a variety of semiconductor materials. The following description discusses several presently preferred embodiments of the semiconductor devices of the present invention as implemented in silicon substrates, since the majority of currently available semiconductor devices are fabricated in silicon substrates and the most commonly encountered applications of the present invention will involve silicon substrates. Nevertheless, the present invention may also advantageously be employed in gallium arsenide, germanium, and other semiconductor materials. Accordingly, the present invention is not intended to be limited to those devices fabricated in silicon semiconductor materials, but will include those devices fabricated in one or more of the available semiconductor materials and technologies available to those skilled in the art, such as thin-film-transistor (TFT) technology using polysilicon on glass substrates.

It should be noted that the drawings are not true to scale. Further, various parts of the active elements have not been drawn to scale. Certain dimensions have been exaggerated in relation to other dimensions in order to provide a clearer illustration and understanding of the present invention.

In addition, although the embodiments illustrated herein are shown in two-dimensional views with various regions having depth and width, it should be clearly understood that these regions are illustrations of only a portion of a device that is actually a three-dimensional structure. Accordingly, these regions will have three dimensions, including length, width, and depth, when fabricated on an actual device.

Moreover, while the present invention is illustrated by preferred embodiments directed to fluid jet printheads, it is not intended that these illustrations be a limitation on the scope or applicability of the present invention. It is not intended that the fluid-jet printheads of the present invention be limited to the physical structures illustrated. These structures are included to demonstrate the utility and application of the present invention to presently preferred embodiments.

Figure 1:
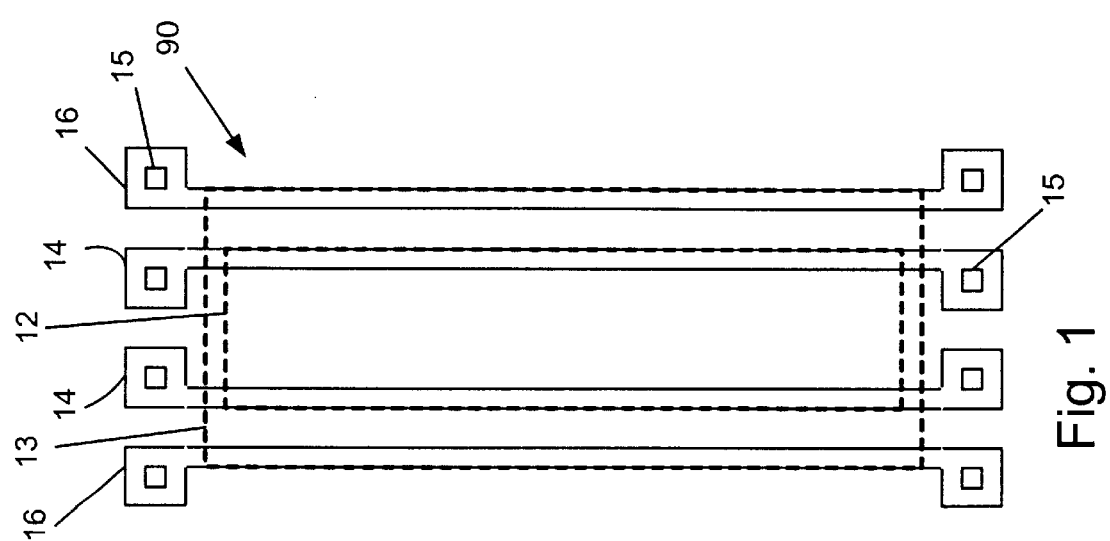
FIG. 1 is a top view of a first embodiment of the invention.

FIG. 1 is a top view of an exemplary test structure 90 that incorporates the invention. In its simplest form, test structure 90 allows for the determination of trench width and/or location. The trench is created by etching a substrate 10 (see FIG. 4) from its backside towards the side with semiconductor thin-film processing. The substrate is preferably silicon but other substrates such as gallium arsenide, germanium, or glass can be used and still meet the spirit and scope of the invention. A desired trench opening is illustrated by trench window 12. Preferably one or more inner electrodes 14 are aligned substantially parallel to one edge of the etch window 12. Preferably, inner electrode 14 intersects the etch window 12 such that an outer edge of etch window 12 abuts an edge of inner electrode 14. The other edge of inner electrode 14 is preferably within the etch window 12. Generally, when wet etching of the substrate 10 occurs, the opening of the etch window 12 will occur near the center of the etch window 12, assuming proper alignment. When dry etching of substrate 10 occurs, the opening of etch window 12 will generally occur simultaneously over the entire etch window. Either way, by the time the etching completes etching the etch window, inner electrode 14 is etched thus causing an electrically detectable opening between endpoints 15 which are outside of the etch window 12. By using more than one inner electrode 14, separate edges of etch window 12 can be detected when etching of those edges is complete. FIG. 1 also shows a pair of outer electrodes 16 that are useful to detect over-etching of the etch process. For instance, if the etch window 12 was misaligned from its desired position, one inner electrode 14 might be etched before the second inner electrode 14 is etched. If the etch process continues, if one of the outer electrodes 16 is etched before the opposite inner electrode 14 is etched, detection of a misalignment occurs. Also, assuming that there is substantially no misalignment, outer electrode 16 can be used to detect over-etching of the etch window 12. In this case, both inner electrodes 14 will be etched by the backside etch process. If one or more of the electrodes 16 are detected as being open and thus etched, then the etch process has continued beyond the desired etch window 12 and an over-etching of the etch window 12 is detected. Alternatively, the inner electrodes 14 and the outer electrodes 16 can be used in conjunction with each other to monitor the progress of a two-step etch process. In the first phase of etching, the etch window 12 is etched by a first etch process (such as a wet or dry etch) and accordingly ended when at least one inner electrode 14 is detected as being open. Then a second phase of etching is started using a second etching process that is used to preferably fine tune and complete etching of a second etch window 13. When at least one or more of the outer electrodes 16 is detected as open, then the second etch process is completed. By monitoring an electrical parameter of at least one of the inner 14 and outer 16 electrodes, feedback into the process of through-substrate etching allows for better process control yielding lower costs and higher yields.

Any one of several etch techniques for silicon substrates in particular can be used. Examples of dry etches include $XeF_2$ and $SF_6$. Examples of appropriate wet etches include ethylene diamine pyrocatecol (EDP), potassium hydroxide (KOH), flourine based acidic etchants, and tetramethyl ammonium hydroxide (TMAH), but preferably TMAH.

Figure 2:
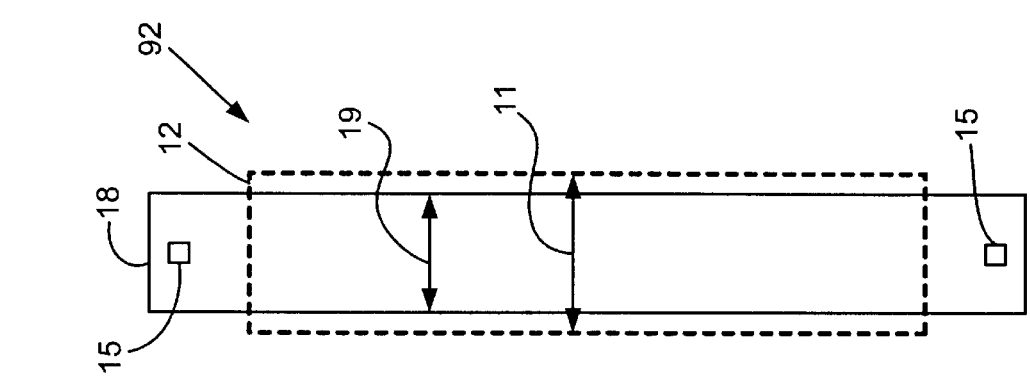
FIG. 2 is a top view of a second embodiment of the invention.

FIG. 2 is an alternative embodiment of the invention shown from a top view perspective. In this embodiment, a second test structure 92 is formed by using a wide electrode 18 that intersects the etch window 12. This single electrode has a first width 19 that is substantially almost the etch window width 11 of etch window 12. In this embodiment, the the endpoints 15 are monitored to detect a discontinuity of the wide electrode 18 during etching of etch window 12. Because the width of wide electrode 18 encompasses most of the width of the etch window, a minimum etch of etch window 12 can be detected when the discontinuity occurs. Alternatively, the first width 19 of the single electrode could be wider than the etch window width 11. In this situation, a discontinuity of wide electrode 18 can be used to detect over-etching of etch window 12.

FIG. 3 is an alternative embodiment of the invention that is used to detect multiple stages of the etching process, optionally including over-etching. In this instance, the width of wide electrode 18 is less than the width of the etch window 12 and represents a minimum etch window 25 that is detected when wide electrode 18 opens. Etching of the etch window 12 continues, until at least one inner electrode 14 is detected as having a change in parameter. The change of parameter is preferably a change of resistance of inner electrode 14. At this point the etch window 12 is about at its desired width 21. If etching continues, the etch window 12 is at its maximum desired opening 23 when an inner electrode 14 is detected as being etched open. This detection stage represents the maximum desired etch window 12 result. However, if the etching is optionally continued or if there are defects on the substrate that cause abnormal etching such as scratches, then detection of outer electrode 16 as being open results in an over-etch width 27 detection of etch window 12.

Figure 4:
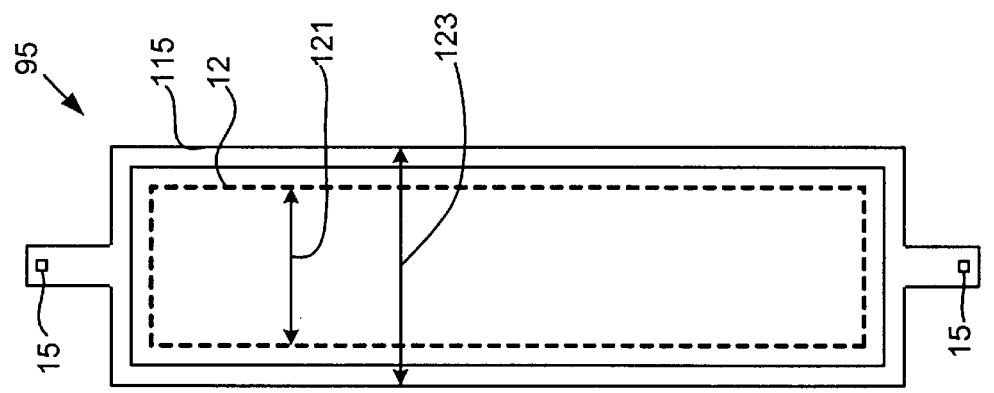
FIG. 4 is a top view of a fourth embodiment of the invention.

FIG. 4 is a top view of an alternative embodiment of the invention. Fourth test structure 95 is formed of a loop of conductors 115 the surrounds the etch window 12. The loop of conductors 115 has endpoints 115 for connection to test and monitoring equipment. In this embodiment a desired etch width 121 is detected as over etched if a change in resistance measured between endpoints 15 occurs. If an open circuit is detected between endpoints 15 then an over etch width 123 is detected. This embodiment allows for detection of over etch on all sides of the etch window.

Figure 5:
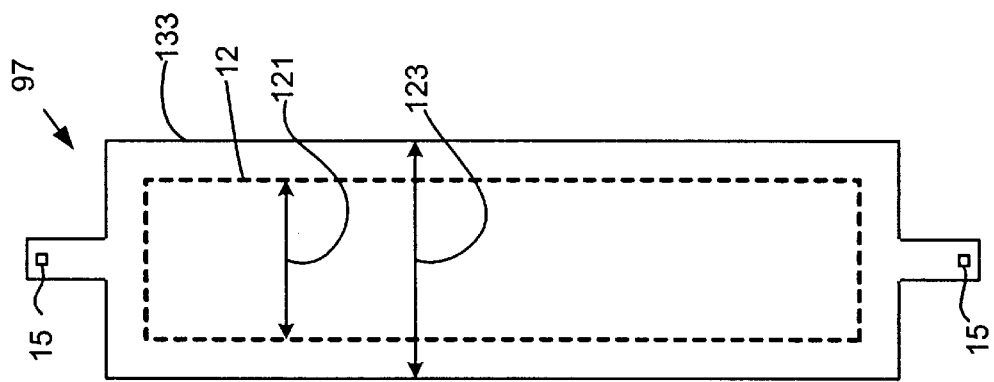
FIG. 5 is a top view of a fifth embodiment of the invention.

FIG. 5 is a top view of an alternative embodiment of the invention, fifth test structure 98. Fifth test structure 97 is a conductive sacrificial electrode that has a larger surface area than the etch window 12 and is disposed such that etch window 12 is preferably centered within the outline of the super wide electrode 133. Etch window 12 has a desired etch width 121. When etch window 12 is etched to the desired etch width 121, a portion of the super wide electrode 133 is removed and the resistance, current, conductance or other parameter measured between endpoints 15 changes. This change is monitored and used to stop etching or tested after etching to verify that proper etching has occurred. If overetching has occurred and the etch window 12 is opened to the over etch width 123, then the super wide electrode 133 will become discontinuous and an open circuit between endpoints 15 is detectable either during etching or during circuit testing.

Although several different embodiments of the invention have been shown and described in FIGS. 1–5, those skilled in the art will appreciate that several different shapes and orientations for creating the sacrificial electrodes can be used and still fall within the spirit and scope of the invention.

Figure 6:
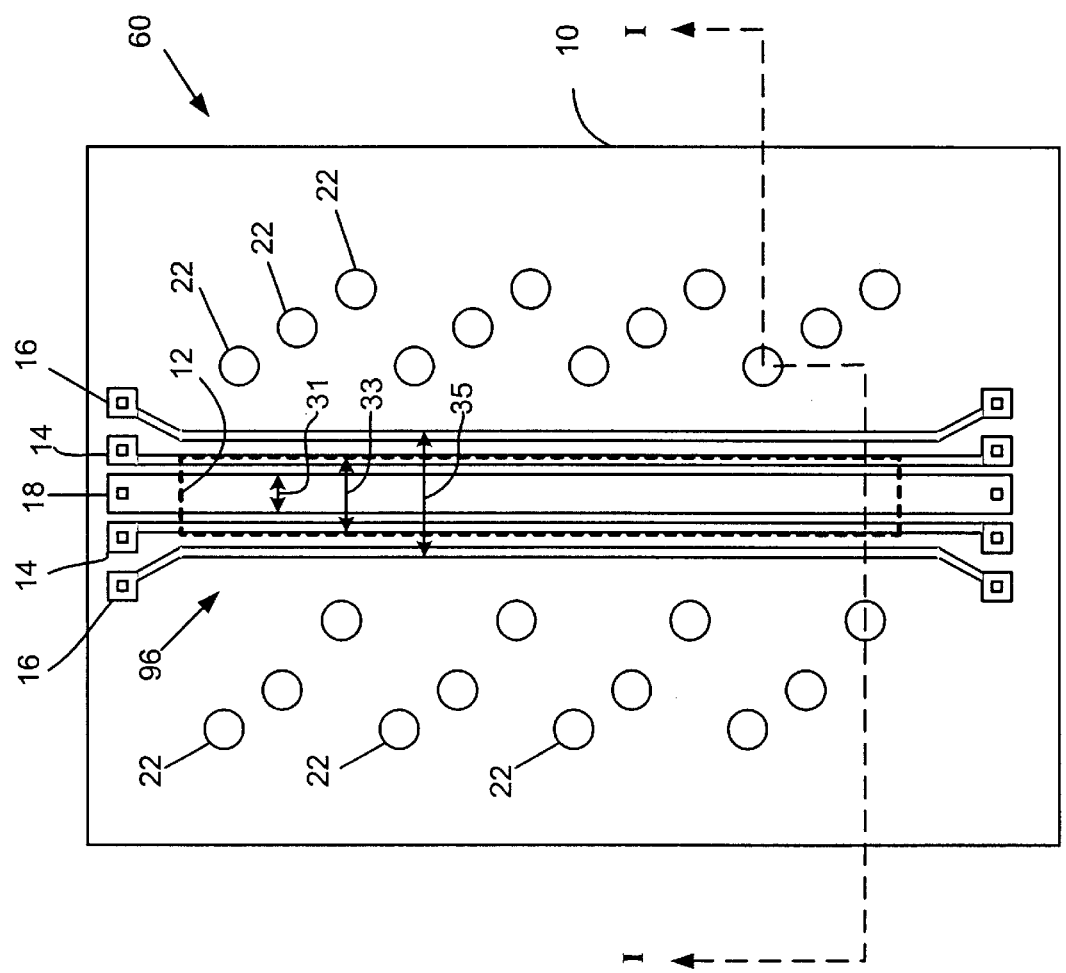
FIG. 6 is a top view of a fluid-jet printhead that incorporates an embodiment of the invention.

FIG. 6 is a top view of an exemplary fluid-jet printhead 60 that incorporates an embodiment of the invention, a sixth test structure 96 to detect a first etch stop 31, a second etch stop 33, and optionally a test width 35 for detecting over-etching of etch window 12. The printhead 60 includes nozzles 22 disposed on substrate 10 for allowing a fluid, such as ink, to be ejected from the printhead 60. The fluid preferably enters the printhead from the opposite side of substrate 10 through fluid feed channels etched into the substrate 10 and opening into a fluid chamber (not shown in FIG. 6 but see FIGS. 7–16) beneath the nozzles 22. The fourth test structure 96 is used to help in at least one of the test process and device testing. The dashed box illustrates the desired opening of etch window 12 after etching is performed. The backside etching is preferably done with a process that ensures alignment of the backside etch with the location of nozzles 22. One approach is to use a two-step process. A first etch is used to create a through hole opening through the substrate 10 into the center of the etch window 12. The width of the wide electrode 18 is chosen to ensure that the first etch has adequately etched through the substrate 10 into etch window 12 yet allowing for some misalignment of the backside masks and the front side mask sets. To prevent the etchant used in the first etch process from attacking thin-film layers deposited on the orifice side of the substrate a front-side mask 35 (see FIG. 5) is used to block the reactant from the fluid chamber. Before starting a second etch, this front side mask is removed to allow the etchant of the second etch to react with the substrate exposed by removal of the front side mask. The second etch then is allowed to proceed to continue etching the through hole in the etch window 12 until at least one or both of the inner electrodes 14 are opened by the second etch. Due to the silicon exposed by removal of the front side mask 34 having a different crystal orientation exposed to the second etchant, it is etched quickly and the opening of the etch window is aligned as desired. Defects in the substrate, such as scratches or cracks, can cause the first and second etching processes to become unpredictable. If over-etching occurs, then the outer electrodes 16 will open and thus over-etching can be detected.

FIG. 7 is a cross section taken along the I—I perspective of FIG. 6 wherein the embodiment of the invention includes just inner electrodes 14 and outer electrodes 16. In this exemplary embodiment, substrate 10 has a diffusion layer 26 in which inner electrodes 14 and outer electrodes 16 reside. If diffusion layer 26 is a P-Well then preferably the inner electrodes 14 and the outer electrodes 16 are made from N+ diffusions. If the diffusion layer 26 is an N-Well then preferably inner electrodes 14 and outer electrodes 16 are P+ diffusions. On the diffusion layer 26 is disposed a stack of thin-film layers 28 that incorporate an ejection element 24. Preferably the ejection element 24 is a thermal resistor but other ejection elements such as piezo elements and electrostrictive elements are known to those skilled in the art and can be used in place of the thermal resistor. Disposed on the stack of thin-film layers 28 is an orifice layer 20 having nozzles 22 disposed over the ejection element 24. The stack of thin-film layers has fluid feed channels extending through the thin-film stack to the surface of the substrate 10. The fluid feed channels are shown having a front side protection 34 applied within to block etchant from the backside etch from reaching the circuitry within the stack of thin-film layers 28. On the opposite side of substrate 10 is a backside etch mask 30 having a backside opening 42 that exposes the substrate 10 to etchant.

Exemplary embodiments of orifice layer 20 include spun-on epoxy SU8 or spun-on polymers such as photoresist. Other orifice layers include polymer barriers with an accompanying orifice plate or the use of kapton film with predrilled nozzle openings. Several other methods of constructing an orifice layer are known to those skilled in the art and can be substituted and still fall within the scope and spirit of the invention.

The front-side protection 34 can be any suitable material such as oxides, nitrides, and oxinitrides that are resistant to the etchants used.

To perform this backside etch result, several different etch procedures are possible. FIGS. 8–10 are the result of a one or two-step etchant process. The etchant process is halted when inner electrode 14 is etched away.

As shown in FIG. 8, a first approach is to use a single wet etch process that etches the backside of substrate 10. An exemplary process is the etching of (100) oriented silicon using a TMAH wet etch. In this single wet etch process, the TMAH etches the silicon substrate at an angle along the <111> plane to form an anisotropic angled profile. This etch process continues until the inner electrodes 14 are etched causing the detection of an open circuit. One aspect of this etch process is that the resulting opening on the backside of substrate 10 can be quite wide due to the angled profile 36 as shown. This need to account for a wide opening may limit this processes application when the size of the resulting printhead die is desired to be minimized. Also, it may be difficult or expensive to add the frontside protection 34.

An alternative second approach in FIG. 9 is to begin etching the backside of the substrate 10 in backside opening 42 with a dry etch in generally an anisotropic fashion until a few thousand Angstroms of the surface of the stack of thin-film layers 28 is reached. Thus, frontside protection 34 is not required. This dry etch results in the profile 58 as shown. Then, a second etch using a wet-etch process is performed to etch the substrate anisotropically until the inner electrode 14 is etched away and electrically opened. The resulting sloped profile is shown as angled edge 32.

In FIG. 10, the outer electrodes 16 can optionally be used to detect for over-etching of the second etch process as shown by over-etched profile 38. By using a dry-etch process to partially etch the through substrate opening, the amount of time the wet-etch process is used can be reduced significantly reducing the possibility of over-etching. FIG. 10 also illustrates that the over-etching can be detected when a portion 40 of outer electrode 16 is etched. If during etching, the resistance of outer electrode 16 is monitored, as it is being etched away its cross-sectional area is reduced and accordingly, its resistance increases. This increased resistance can then be used to stop etching before the outer electrode is entirely etched causing an open circuit. Accordingly, this measurement of resistance parameter rather than detecting an open circuit can also be used for inner electrode 14, wide electrode 18, or other electrodes used.

FIG. 11 is a cross-sectional drawing of a printhead in which only the wide electrode 18 is used to control the etching process. In this embodiment, the wide electrode 18 is made from a conductive thin-film trace in the stack of thin-film layers 28 that are disposed on diffused layer 26. Alternatively, wide electrode 18 could also be implemented as a doped diffusion in the diffusion layer 26 as were inner electrodes 14 and outer electrodes 16 in FIGS. 7–10. Accordingly, the inner electrodes 14 and the outer electrodes 16 shown in FIGS. 7–10 can also be implemented as conductive or semi conductive thin-film layers in the stack of thin-film layers 28.

FIG. 12 illustrates the result of an etching process on the substrate 10 shown in FIG. 11. A first wet etch process is used and etches the substrate 10 until wide electrode 18 is reached and etched. When wide electrode 18 is etched it presents an open circuit that detects and indicates the end of the first etch step. Then, the front side protection 34 is removed and a second etch process is performed, preferably a wet-etch to attack the substrate and self-align the etched profile 32 with the fluid feed holes through the stack of thin-film layers 28. Because the end of the first etch is detected with the etching of the wide electrode 18, the amount of time required for the second etch is minimized. This combination of steps helps to prevent over-etching by ensuring that the first etch step does not etch beyond that necessary to completely open wide electrode 18.

FIGS. 13 and 14 illustrate an embodiment of the invention that allows for wide electrode 18, inner electrodes 14, and outer electrodes 16 to be used to control etching of substrate 10 with a two-step etch process. In this example, front side protection 34 is used to prevent a first etchant from attacking the thin-film layers in the stack of thin-film layers 28. The first etchant attacks the substrate 10 in opening 42. For a silicon substrate with a (100) orientation, preferably TMAH etchant is used to create an angled profile along the <111> planes of the substrate 10. When wide electrode 18 is etched, it becomes an open circuit and thus indicates detection of the end of the first etch of the process. The front-side protection 34 is removed and a second etchant, preferably TMAH, is used to complete the etching of substrate 10 until at least one of the inner electrodes 14 is etched leaving outer electrodes 16 unetched. The outer electrodes 16 can be used to detect over-etching of the second etch process.

FIGS. 15–18 illustrate a method of monitoring the process of etching substrate 10 using an embodiment of the invention. In this embodiment, wide electrode 18 is a conductive layer in the stack of thin-film layers 28 and contacts electrically the substrate 10. In this embodiment a voltage potential is placed between wide electrode 18 and counter electrode 99 in an etchant tank having etchant solution. During etching in FIG. 15, the current between wide electrode 18 and the counter electrode 99 can be monitored. FIG. 17 is a schematic of the etching process shown in FIG. 15. A voltage source 85 provides the voltage potential that is applied to wide electrodes 18. As shown, one or more wide electrodes 18 can be parallel to monitor one or more sites on a wafer when it is immersed in the etchant solution. Each of the wide electrodes 18 have a resistance $R_{electrodes}$ which varies when the etchant solution begins to attack it. The substrate 10 is shown as having a variable resistance $R_{substrate}$ 88 that will change as the backside etch is performed. The etchant solution has a resistance $R_{etchant}$ 86 that generally stays substantially contstant during the etching process although it may vary slightly. As the first etch occurs in FIG. 15, a first charge region 46 of charges 44 is formed between the wide electrode 18 and the first partial etch 48. In FIG. 16, further etching has occurred to create a second partial etch 50. Because this second partial etch 50 extends further into the substrate 10, there is less volume for the charges 44 to exist, thus forming a reduced second charge region 52 and allowing for increased current flow. This change in charge region reflects a lowering of resistance ($R_{substrate}$88) to electrical current in substrate 10. This change in resistance of $R_{substrate}$88 (or alternatively the current through $R_{substrate}$88) is related to the amount of etching performed and thus can be used to precisely monitor rate the etching process. When the substrate is etched through, then the etchant will attack the sacrificial wide electrode 18 is causing its resistance $R_{electrodes}$ to increase and if a break occurs then an open circuit is formed and no current will flow. An illustration of the substrate etching current profile 89 measured by current meter 84 in FIG. 17 is shown in FIG. 18. As the substrate is etched, there is less substrate material causing the current to rise. Once the substrate 10 is etched, then etching of sacrificial electrode 18 occurs. As sacrificial wide electrode 18 is etched, its resistance increases causing the current measured by current meter 84 to decrease as shown by electrode current profile 87 in FIG. 18. As the wide electrode 18 is further etched and an open circuit occurs, the current measured by current meter 84 falls to zero and the end of etching is detected. The actual current profile will depend on the embodiment of wide electrode 18 chosen, the etchant solution used, and the substrate material and doping. FIG. 18 is a simplified current profile shown for illustrative purposes only.

When the substrate 10 is etched, the path that current must flow through is essentially lengthened as the etch window has an increasing channel depth. For instance, generally the resistance measured, R, is proportional to the resistivity of the substrate, ρ, the length of current flow in the substrate between the electrode and back of the substrate, 1, and inversely proportional to the cross-sectional area, A, in which the current flows such that $$R = \rho \frac{l}{A}.$$

For a non-etched substrate, A is equal to the product of the depth, λ, and the width, w, where the charge is concentrated between the electrode and back of the substrate. Therefore, by varying the path that the current will pass through, a change in resistance will occur. The relationship governing the change of resistance is given by the generalized form of Ohm's law, $$\vec{J} = \frac{\vec{E}}{\rho},$$

where $\vec{J}$ is the current density, $\vec{E}$ is the electric field and ρ is the resistivity of the substrate. This detection of the rate of etching can be used to feedback information to the etch tool or operator to modify the etch process such as requesting more etchant, increasing/decreasing temperature, etc.

Figure 19:
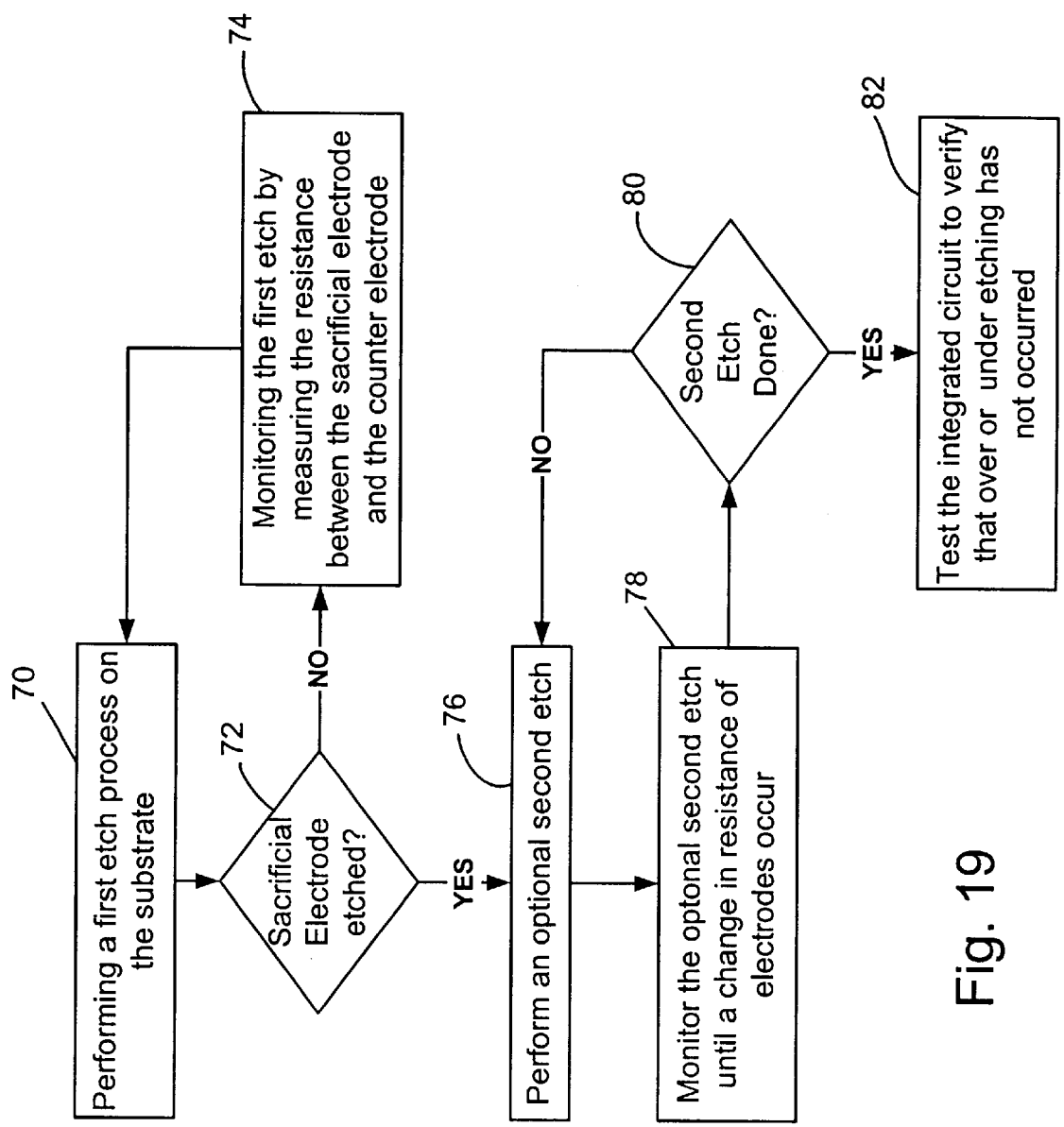
FIG. 19 is a flow chart of an exemplary process that uses an embodiment of the invention to control backside etching of a conductive or semi-conductive substrate.

FIG. 19 is an exemplary flow chart of process steps that can be used to etch a substrate using embodiments of the invention. In step 70, a first etch process is performed on the substrate. In step 72, a sacrificial electrode is checked to determine if it has been etched completely. If not, then in step 74, the first etch is optionally monitored by measuring the resistance between the substrate and the sacrificial electrode while the first etch process of step 70 is continued. If the sacrificial electrode is etched away (gone) and an open circuit exists, then an option second etch is performed in step 76. Prior to the optional second etch being performed several conventional steps such as removing the frontside protection, rinsing, drying and cleaning the substrate may be performed. In step 78, during the optional second etching process, other sacrificial electrodes are monitored to detect a change in resistance. The change in resistance can be detected in optionally a linear (analog) or digital fashion (such as open—short). In step 80, a decision is made based on the monitored resistance whether the second etch is done. If not, then the optional second etch is continued. If yes, then in step 82, the integrated circuits on the substrate are tested to verify that over-etching or under-etching has not occurred. If desired, more etching steps can be performed but for cost and time reasons, it is preferable that only one etchant step be performed. However, it may be advantageous to use two steps to further ensure self-alignment.

FIG. 20 is an illustration of a semiconductor substrate 100, preferably of silicon, used to create integrated circuits. The integrated circuits 106 can individually incorporate an embodiment of the invention or an embodiment of the invention can be incorporated into test cells 102 placed on the semiconductor substrate 100. An alignment edge 104 is used to help align the backside photomask with the frontside thin-film layers. In this embodiment, test cells 102 include another embodiment of the invention, a combined electrode 114 that has several individual electrodes that intersect the desired etch window 108. The individual electrodes are made of resistive material. To simplify monitoring of the etch process, the separate electrodes are connected (combined) together. When the etch process etches the electrodes starting from the center and working towards the outer edges, the resistance changes.

FIG. 21 illustrates a typical setup for a wet-etch process. In this example, an etchant tank 110 contains the etchant solution 112 that is used to etch semiconductor substrate 100. A test device 118 having a test display 120 is connected to the counter electrode 99 and at least one test structure 102 via leads 116 to test ports 122. The test device 118 detects the changes in resistance of the semiconductor substrate 100 and combined electrode 114 in the test structure 102 and provides instructions on the test display 120 to an operator. Optionally, the test device 118 can issue commands to an etch controller that controls the etchant, temperature or agitation of the etchant tank 110. The test device 118 preferably includes the voltage source 85 and the current monitor 84 shown in FIG. 17.

Figure 22:
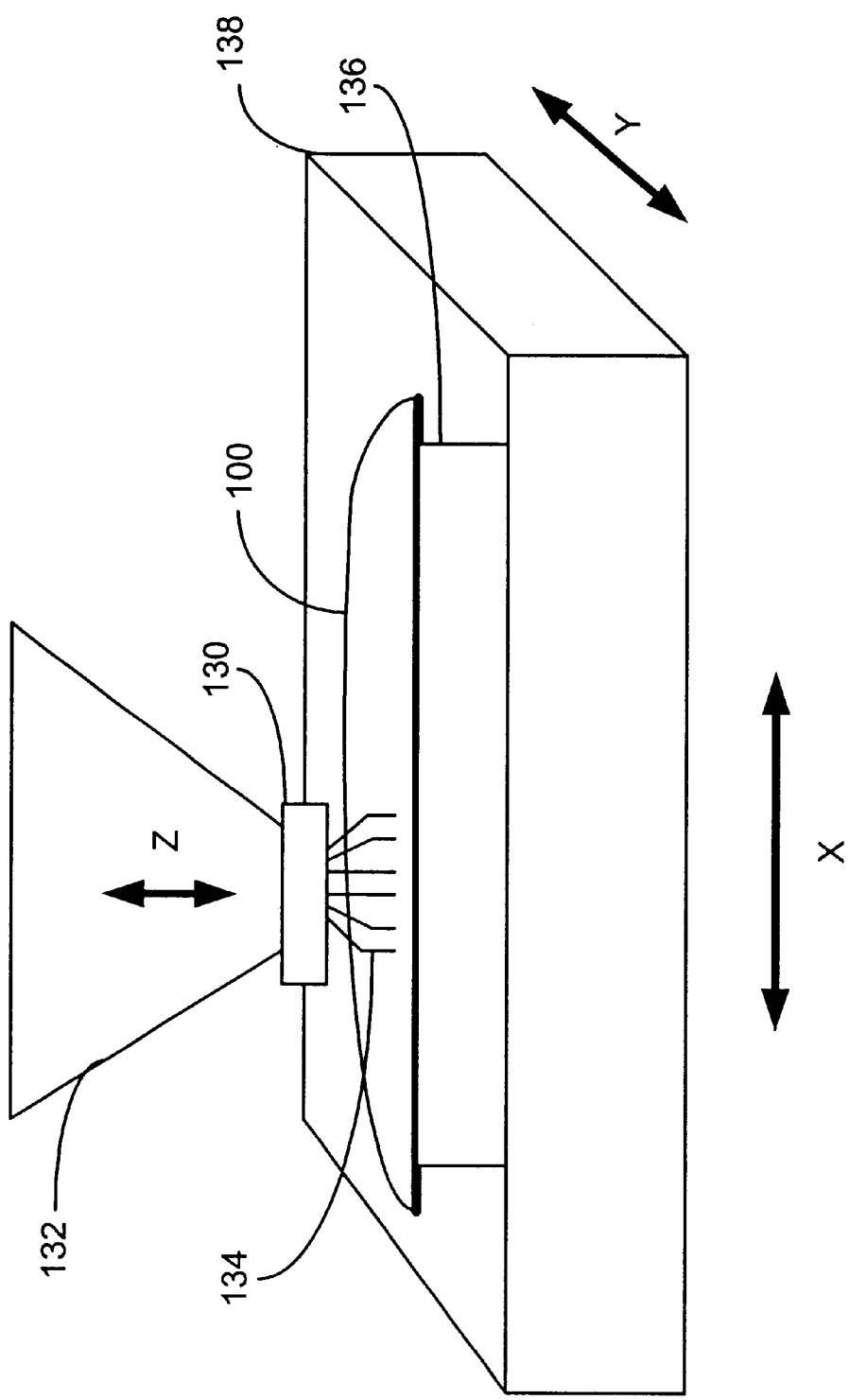
FIG. 22 is an illustration of an integrated circuit tester verifying the results of a backside etch process by measuring parameters of an embodiment of the invention.

FIG. 22 is an exemplary illustration of a process used to test the integrated circuits after they have been etched. In this example, the semiconductor substrate 100 is placed on a test chuck 136 that is attached to an X-Y movable table 138 that is programmed to move from IC to IC on the semiconductor substrate. A test head 132 that connects to a conventional IC tester has a probe card 130 with IC probes 134 attached to it. The test head 132 and the probe card 130 are movable relative to the semiconductor substrate in a Z direction to facilitate movement of the probe card 130 to each of the ICs on the semiconductor substrate 100 without damaging the IC probes 134. When the IC probes contact an integrated circuit or test structure that includes an embodiment of the invention, the sacrificial electrodes can be tested for either open/short or electrical resistance to determine if the etching process was performed properly for that particular IC or test structure.

The description of several embodiments of the invention for determining the progress and result of back etching of a substrate have been described and their use explained. The invention provides numerous advantages over the visual techniques of the current art, especially in high volume manufacturing. Additionally, the invention can be used in conjunction with or in replacement of the existing visual processes as required to provide precision micro-machining of channel structures in substrates. By replacing the visual inspection process, lower costs for manufacturing and accordingly part cost are achieved. Although several embodiments have been shown and described, the invention is only limited by the appended claims.

What is claimed is:

1. A method of monitoring a through-substrate etching process, comprising the steps of:

providing a sacrificial electrode in proximity to a desired etch window;

performing an etch process on the substrate; and monitoring the etch by measuring an electrical property of at least one of the sacrificial electrode and the substrate, wherein the sacrificial electrode intersects the desired etch window.

2. The method of claim 1 wherein the sacrificial electrode is adjacent and substantially parallel to the desired etch window.

3. The method of claim 1 wherein the process further includes the step of feeding back the measured electrical property to a controller performing the etch process.

4. A method of monitoring a through-substrate etching process, comprising the steps of:

providing a sacrificial electrode intersecting a desired etch window;

performing a first etch process on the substrate; and monitoring the first etch by measuring at least one electrical property of at least one of the sacrificial electrode and the substrate.

5. A method of monitoring a through-substrate etching process, comprising the steps of:

providing a sacrificial electrode intersecting a desired etch window;

performing a first etch process on the substrates monitoring the first etch by measuring at least one electrical property of at least one of the sacrificial electrode and the substrate, providing at least one in-situ electrode substantially parallel to the desired etch window;

upon detection of an opening of the sacrificial electrode, performing a second etch process on the substrate; and monitoring the second etch by measuring at least one electrical property of the in-situ electrode until a substantial change in the electrical property occurs.

6. A method of monitoring a through-substrate etching process, comprising the steps of:

providing a sacrificial electrode intersecting a desired etch window;

performing a first etch process on the substrate;

monitoring the first etch by measuring at least one electrical property of at least one of the sacrificial electrode and the substrate;

providing at least one in-situ electrode substantially parallel to the desired etch window; and testing the electrical property of the at least one in-situ electrode to verify that over-etching of the first etch process has not occurred.

7. A method for etching openings within a conductive substrate having a backside, comprising the steps of:

providing at least one sacrificial electrode in proximity to an etch window;

etching the backside of the conductive substrate;

measuring at least one electrical property of the at least one sacrificial electrode and the substrate; and stopping the step of etching when the measured electrical property triggers a predetermined value.

* * * * *

UNITED STATES PATENT AND TRADEMARK OFFICE
CERTIFICATE OF CORRECTION

PATENT NO. : 6,599,761 B2
DATED : July 29, 2003
INVENTOR(S) : Hess et al.

It is certified that error appears in the above-identified patent and that said Letters Patent is hereby corrected as shown below:

<u>Column 12,</u>
Line 1, delete "substrates" and insert therefor -- substrate; --

Signed and Sealed this

Third Day of February, 2004

JON W. DUDAS
*Acting Director of the United States Patent and Trademark Office*